(12) United States Patent
Dykstra

(10) Patent No.: US 6,629,508 B2
(45) Date of Patent: Oct. 7, 2003

(54) IONIZER FOR GAS CLUSTER ION BEAM FORMATION

(75) Inventor: Jerald P. Dykstra, Austin, TX (US)

(73) Assignee: Epion Corporation, Billerica, MA (US)

(*) Notice: Subject to any disclaimer, the term of this patent is extended or adjusted under 35 U.S.C. 154(b) by 0 days.

(21) Appl. No.: 09/733,211

(22) Filed: Dec. 8, 2000

(65) Prior Publication Data

US 2002/0162508 A1 Nov. 7, 2002

Related U.S. Application Data

(60) Provisional application No. 60/170,197, filed on Dec. 10, 1999.

(51) Int. Cl.$^7$ .......................... C23C 16/00; H05B 31/26
(52) U.S. Cl. .......................... 118/723 CB; 118/723 FE; 118/723 MP; 250/427; 315/111.81; 315/111.91
(58) Field of Search .................... 118/723 CB, 723 EB, 118/723 MP, 723 FE, 723 FI, 723 HC, 723 VE; 250/427; 315/111.81, 111.91

(56) References Cited

U.S. PATENT DOCUMENTS

| | | | |
|---|---|---|---|
| 3,514,666 A | | 5/1970 | Elmore ........................ 315/111 |
| 3,913,520 A | * | 10/1975 | Berg et al. ............ 118/723 VE |
| 4,007,374 A | | 2/1977 | Solomon .................... 250/384 |
| 4,811,690 A | * | 3/1989 | Kawagoe et al. ......... 118/723 I |
| 4,833,319 A | * | 5/1989 | Knauer ........................ 250/251 |
| 4,886,969 A | | 12/1989 | Knauer ........................ 250/427 |
| 4,960,990 A | | 10/1990 | Lavan et al. ................ 250/251 |
| 5,099,791 A | * | 3/1992 | Tsukazaki et al. ..... 118/723 CB |
| 5,354,445 A | | 10/1994 | Ito et al. ................. 204/298.05 |
| 5,521,389 A | | 5/1996 | Kim ........................ 250/423 R |
| 5,531,420 A | | 7/1996 | Benveniste ................. 250/251 |
| 5,814,194 A | | 9/1998 | Deguchi et al. ......... 204/192.1 |

FOREIGN PATENT DOCUMENTS

| | | |
|---|---|---|
| DE | 19627004 A | 1/1998 |
| JP | 60124916 | 7/1985 |
| JP | 63216967 | 9/1988 |
| JP | 03158458 | 7/1991 |
| SU | 953677 | 8/1982 |
| SU | 1434508 | 10/1988 |
| WO | WO 0143160 A | 6/2001 |

OTHER PUBLICATIONS

"Current Status of Ionized–Cluster Beam Technique: A Low Energy Ion Beam Deposition" by Yamada et al.; 1987 Nuclear Instruments and Methods in Physics Research; North Holland, Amsterdam; pp.: 120–123.

(List continued on next page.)

*Primary Examiner*—Rodney G. McDonald
(74) *Attorney, Agent, or Firm*—Perkins, Smith & Cohen; Jerry Cohen

(57) ABSTRACT

A neutral beam ionizing apparatus for electron impact ionization of a substantially cylindrical neutral beam. The apparatus includes an electron source, and a circularly cylindrical ionizing region that is substantially free of magnetic fields. In one embodiment of the invention, the beam is a gas cluster beam, and the electron source includes a heated filament for emitting thermions, the filament including one or more direction reversals shaped to produce self-nulling magnetic fields so as to minimize the magnetic field due to filament heating current. In another embodiment of the invention, a neutral beam ionizing apparatus for electron impact ionization of a substantially cylindrical neutral beam includes at least one electron source, and an elliptically cylindrical ionizing region. In one embodiment, the elliptically cylindrical ionizing region includes a pair of co-focal elliptically cylindrical electrodes biased so as to cause electrons emitted from the at least one electron source to orbit repeatedly through the axis of the beam to be ionized.

17 Claims, 11 Drawing Sheets

OTHER PUBLICATIONS

"Cluster Formation in Expanding Supersonic Jets: Effect of Pressure, Temperature, Nozzle Size, and Test Gas"; by Hagena et al., The Journal of Chemical Physics; vol. 56, No. 5, Mar. 1, 1972.

"An Investigation of Cluster Formation In An Ionized Cluster Beam Deposition Source"; by McEachern et al., 1991 American Vacuum Society; pp. 3105–3112.

"Ionized Gases"; by A. Von Engel; American Vacuum Society Classics; American Institute of Physics; Production of Charged Particles.

Scientific Foundations of Vacuum Technique; Second Edition; by Saul Dushman; "Kinetic Theory of Gases".

* cited by examiner

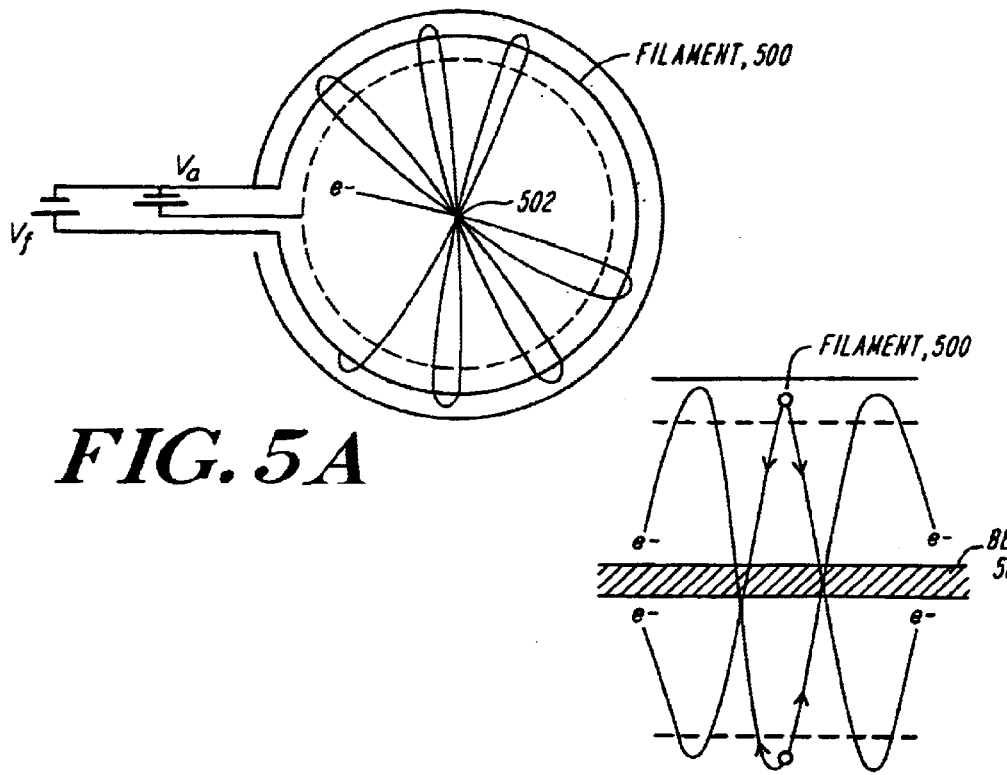
*FIG. 5A*
*FIG. 5B*
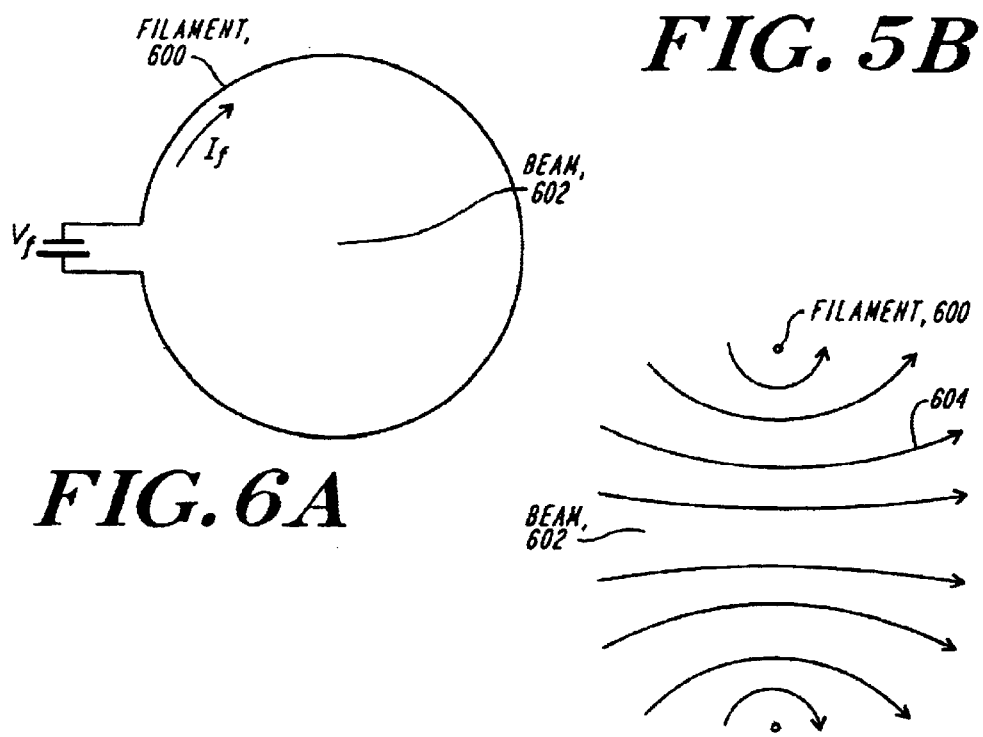
*FIG. 6A*
*FIG. 6B*

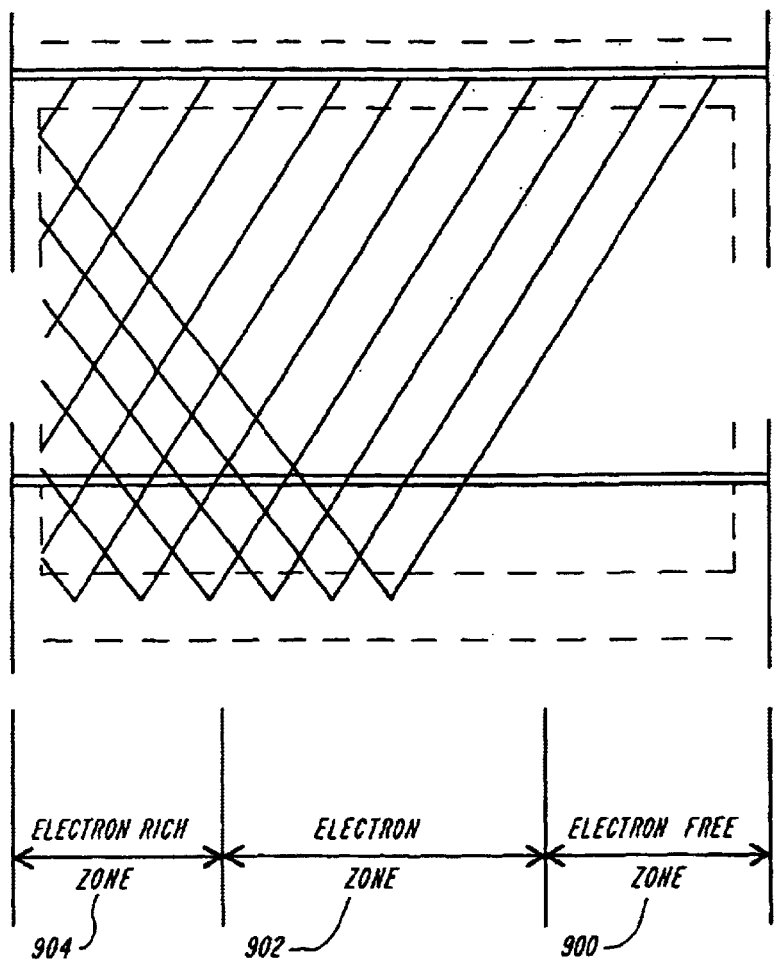
FIG. 9
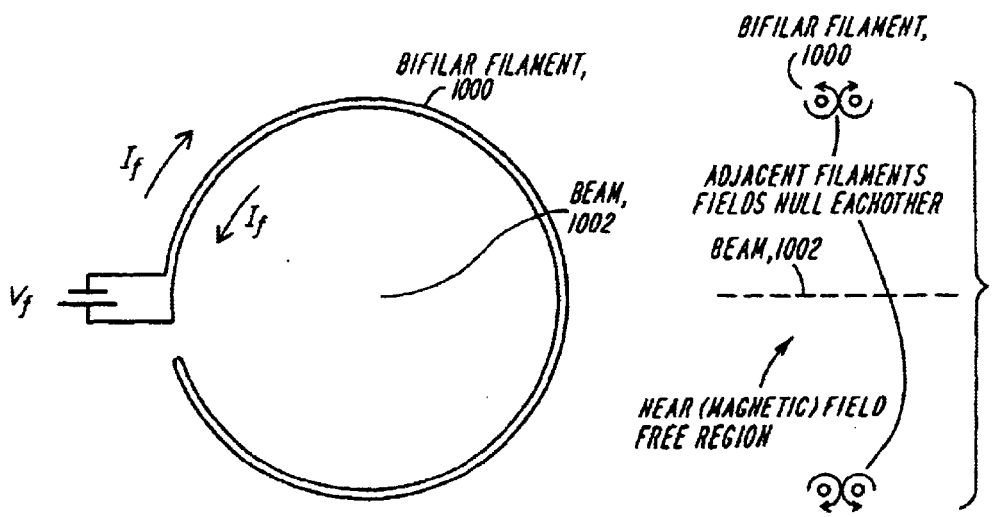
FIG. 10A  FIG. 10B

IONIZER FOR GAS CLUSTER ION BEAM FORMATION

PRIORITY INFORMATION

This application claims priority from provisional application Ser. No. 60/170,197 filed Dec. 10, 1999.

BACKGROUND OF THE INVENTION

The invention relates to the field of ionizers for gas cluster ion beam formation.

It has been shown that ionized beams of gas clusters can be accelerated and directed toward a target or work-piece surface to produce various desirable effects—cleaning, smoothing, sputter etching, deposition, implantation, etc. A body of literature describes the creation and application of gas cluster ion beams. See, for example, U.S. Pat. No. 5,814,194 issued to Deguchi et al.

FIG. 1 is a functional block diagram of a conventional gas cluster ion beam processing system 100 with a differential vacuum pumping scheme. Gas clusters are formed by creating, with a properly shaped nozzle 102, a cluster jet of gas flowing into a region 104 of substantially reduced pressure. Cooling by adiabatic expansion causes the gas to condense into clusters of from several to several thousand atoms or molecules. A gas skimmer aperture 106 is used to separate the gas molecules that have not been converted into clusters from the cluster jet, minimizing pressure in the downstream regions where such higher pressures would be detrimental (e.g., ionizer 108, accelerator 110, and process chamber 112).

Although not essential, it is sometimes desirable to also employ a differential vacuum pumping scheme, as shown in FIG. 1, to further help isolate the downstream regions from the higher pressure source region. Suitable source 114 gases are (for example) argon, other inert gases, oxygen, nitrogen, oxygen bearing gases such as carbon dioxide, nitrogen bearing gases, halogens and halogen bearing gases. Because, during cluster impact, transiently high temperatures and pressures obtain, chemical reactions are facilitated. Therefore, chemically reactive gases like oxygen, nitrogen, halogens or gases bearing those elements as a constituent are also used because of the surface chemical reactions they can effect. Inert gases process the substrate surfaces by mechanical action. Of course, mixtures of inert gases with reactive gases are also possible.

After the cluster jet (which is a substantially neutral beam of clusters) has been formed, the clusters are ionized in the ionizer 108. The ionizer is typically an electron impact ionizer that produces thermal electrons from one or more incandescent filaments. It accelerates and directs the electrons, causing them to collide with the gas clusters in the gas cluster jet. The electron impact ejects electrons from the clusters, causing part of the clusters to become positively ionized.

Once ionized, suitably biased electrodes extract the cluster ions from the ionizer, focus them to form a beam, and accelerate them to a desired energy, typically from 1 keV to several tens of keV or perhaps even a few hundred keV. Not shown, but sometimes utilized, is a mass selector for selecting clusters of a certain mass or within a certain range of masses. Such mass selectors can be, for example, a transverse magnetic field for deflecting monomser ions and other light ions (such as cluster ions having approximately ten or fewer atoms or molecules) out of the beam and passing more massive cluster ions. The accelerated ion clusters may be scanned by scanning mechanisms 116 using well known electrostatic scanning techniques to uniformly process the surface of the target 118 or work-piece. The extracting, focusing, accelerating, mass selecting, and scanning all are made possible by virtue of the fact that the beam of clusters is ionized.

GCIB can be used for many surface processes: smoothing, etching, reacting, depositing, etc. Many of the preferred GCIB processes produce their desired results in proportion to the intensity of the ionized cluster beam that is delivered to the target or work-piece. The beam intensity is dependent on several factors, including: intensity of the neutral gas cluster jet formed by the nozzle (cluster formation efficiency); fraction of the neutral cluster jet that is subsequently ionized (the ionization efficiency); and fraction of the ionized clusters that are subsequently transported to the target or work-piece (the transport efficiency).

Other factors such of the acceleration potential, the cluster size, the constituent gas of the clusters, etc. are also important to the effectiveness and efficiency of the process.

One of the objects of the invention is to improve the efficiency of GCIB processing by increasing the fraction of the neutral clusters in the jet which become ionized (increasing ionization efficiency). Since increased ionization efficiency can increase the GCIB intensity, then it follows that the productivity of various GCIB processes will be improved by increased ionization efficiency.

SUMMARY OF THE INVENTION

Accordingly, the invention provides a neutral beam ionizing apparatus for electron impact ionization of a substantially cylindrical neutral beam. The apparatus includes an electron source, and a circularly cylindrical ionizing region that is substantially free of magnetic fields. In one embodiment of the invention, the beam is a gas cluster beam, and the electron source includes a heated filament for emitting thermions, the filament including one or more direction reversals shaped to produce self-nulling magnetic fields so as to minimize the magnetic field due to filament heating current. The filament can be bifilarly, multi-filarly, or non-inductively wound around the circumference of the cylinder. In another embodiment, the cylindrical ionizing region includes a pair of concentric cylindrical electrodes biased so as to cause electrons emitted from the electron source to orbit repeatedly through the axis of the beam to be ionized.

In accordance with another embodiment of the invention there is provided a neutral beam ionizing apparatus for electron impact ionization of a substantially cylindrical neutral beam, the ionizing apparatus including at least one electron source, and an elliptically cylindrical ionizing region. In one embodiment, the elliptically cylindrical ionizing region includes a pair of co-focal elliptically cylindrical electrodes biased so as to cause electrons emitted from the at least one electron source to orbit repeatedly through the axis of the beam to be ionized. The neutral beam axis can lie substantially along a first focus of the elliptical cylinder and an electron source can lie along a second focus of the elliptical cylinder. The at least one electron source can include a non-inductively formed filament surrounded by a cylindrical anode concentric with the second focus of the elliptical cylinder. In an alternative embodiment, the neutral beam axis lies substantially along a first focus of the elliptical cylinder, and the electron sources are disposed to lie outside of the elliptical cylinder and to direct one or more beams of electrons through a focus of the elliptical cylinder. In other embodiments, at least one electron source includes at least one electron gun disposed to direct at least one beam of electrons through the second focus of the elliptical cylinder. In another embodiment, the at least one electron source includes a virtual source such that said electrons travel in orbits appearing to originate at the second focus. In all of the embodiments, the beam to be ionized can be a gas cluster beam.

BRIEF DESCRIPTION OF THE DRAWINGS

FIGS. 5A and 5B are functional block diagrams of a ring filament 500 and beam 502 arrangement viewed along the beam axis and perpendicular to the beam axis, respectively;

FIGS. 6A and 6B are schematic diagrams of a ring filament, a beam, and a magnetic field caused by the ring filament, viewed along the beam axis and perpendicular to the beam axis, respectively;

FIG. 9 is a schematic diagram illustrating the electron gradient and accumulation of electrons at one end for the case of uniform emission along the length of filaments;

FIGS. 10A and 10B are functional block diagrams of a bifilar filament and beam arrangement viewed along the beam axis and perpendicular to the beam axis, respectively;

DETAILED DESCRIPTION OF THE INVENTION

Figure 1:
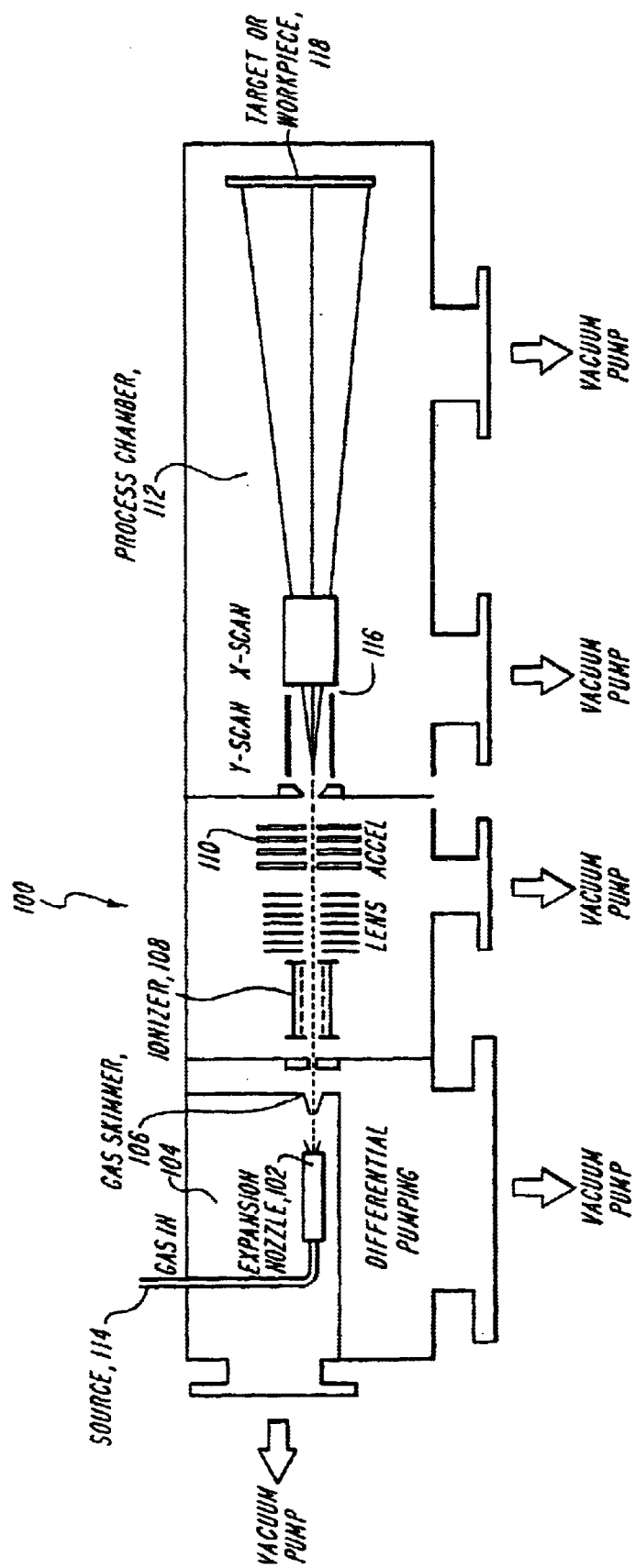
FIG. 1 is functional block diagram of a conventional gas cluster ion beam processing system with a differential vacuum pumping scheme.
Figure 2:
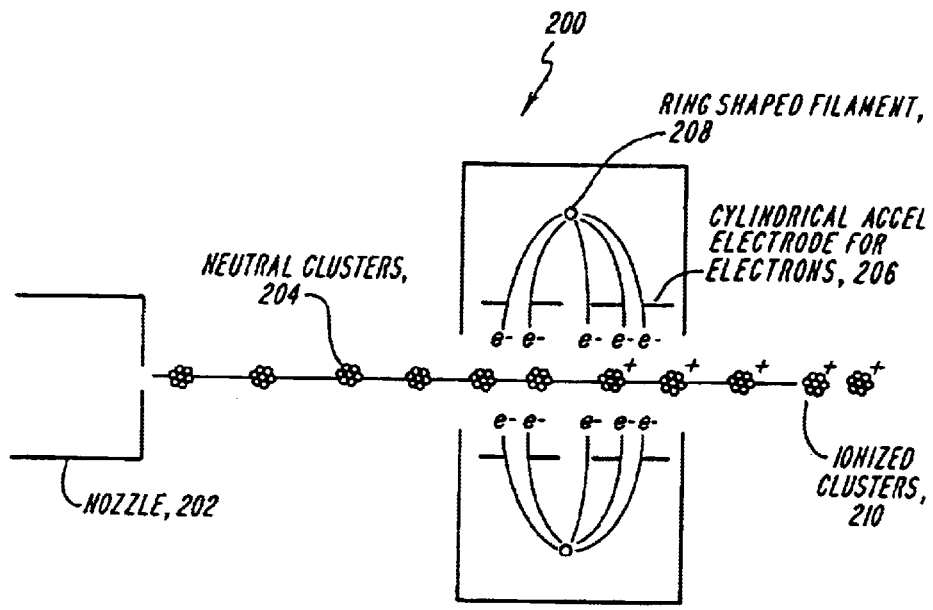
FIG. 2 is a functional block diagram of a conventional ionizer arrangement.

Conventional systems for producing GCIB's commonly have a cylindrically symmetric geometry, being substantially symmetric about the axis of the cluster beam. Often the ionizer has the same cylindrical symmetry or is at least arrayed cylindrically about the central beam axis. An example, referred to as the "ring-filament" geometry, is shown in FIG. 2. FIG. 2 is a functional block diagram of a conventional ionizer arrangement 200 of a nozzle 202 forming a stream of neutral clusters 204. The clusters are passed through a cylindrical accelerator electrode 206 for electrons with a ring shaped filament 208 to generate the ionized clusters 210.

The ring-filament geometry was originally proposed for use with ion cluster beams before the concept of GCIB existed. The clusters were typically clusters of a vaporized solid condensed by expansion through a nozzle in the vaporizer oven. The same concept as applied to GCIB would be the configuration shown in FIG. 3.

Figure 3:
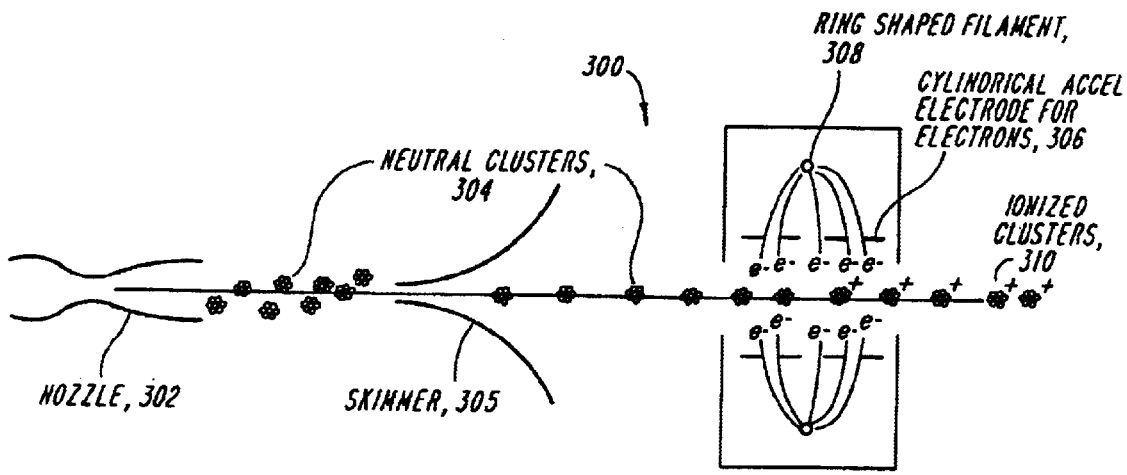
FIG. 3 is a functional block diagram of a conventional GCIB ionizer arrangement.

FIG. 3 is a functional block diagram of a conventional GCIB ionizer arrangement 300 of a nozzle 302 forming a stream of neutral clusters 304 with a skimmer 305. The clusters are passed through a cylindrical accelerator electrode 306 for electrons with a ring shaped filament 308 to generate the ionized clusters 310.

The difference between FIGS. 2 and 3 is the source of the cluster jet. In FIG. 3, gas clusters are formed by creating a supersonic jet of gas through a properly shaped nozzle into a region of substantially reduced pressure. Adiabatic expansion causes the gas to condense into clusters of atoms or molecules. The gas skimmer aperture separates the majority of the gas molecules from the cluster jet forming a neutral cluster beam.

In both cases, a ring-shaped-filament surrounds the cluster beam. The thermionic filament is electrically heated to emit thermal electrons, which are usually accelerated by a biased acceleration grid electrode, into the substantially cylindrical beam of neutral clusters. Some of the energetic electrons strike atoms in some of the neutral clusters, ionizing the atoms by electron impact ionization (ejection of an electron by impact of the incident electron). Such clusters thus acquire a positive charge and are referred to as cluster ions or in the case of gas clusters, gas cluster ions.

Figure 4:
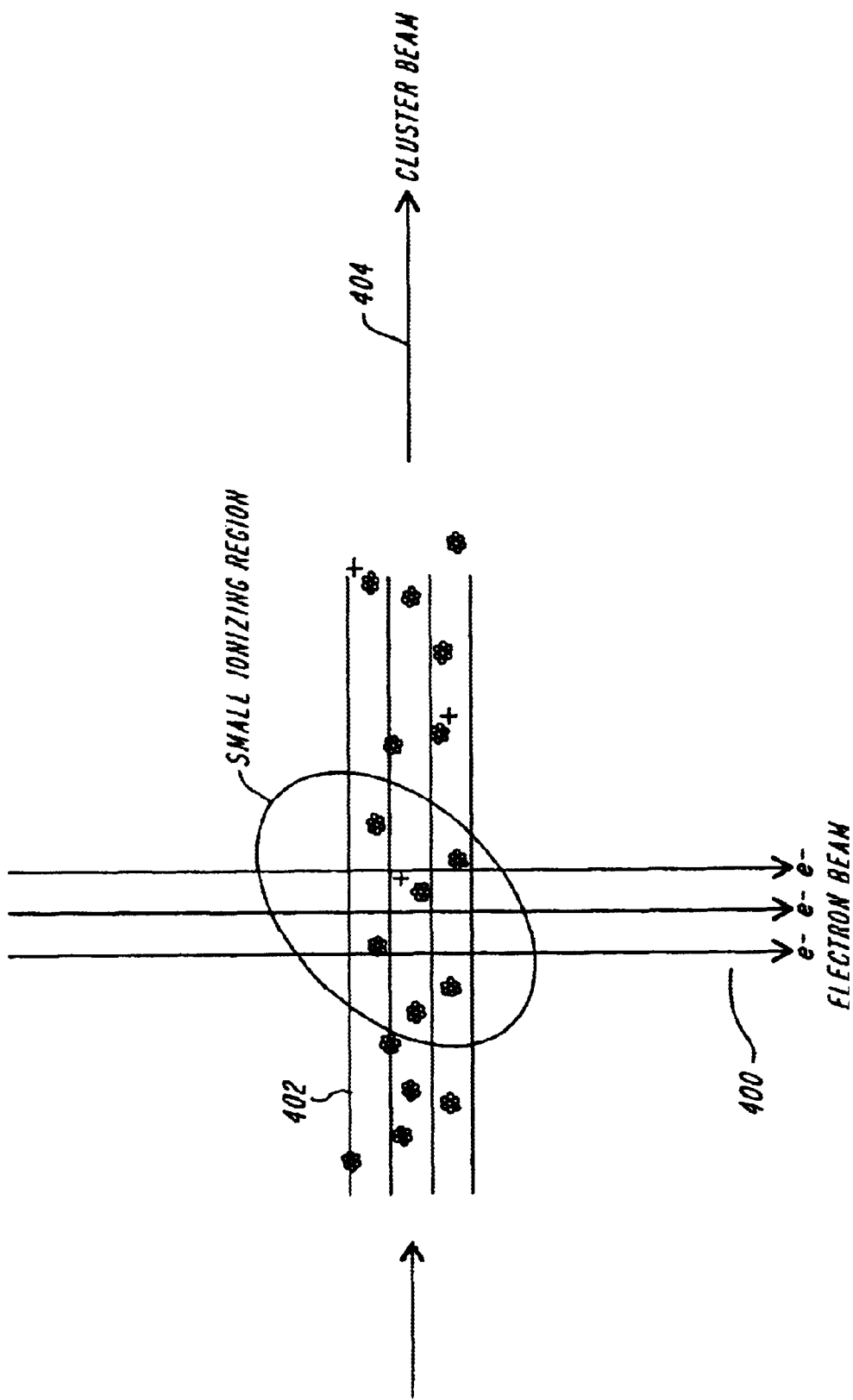
FIG. 4 is a functional block diagram of another conventional GCIB ionizer arrangement.

Other conventional approaches to cluster ionization include directing an electron beam 400 (which could be diffuse or pencil shaped or sheet shaped) perpendicularly across a neutral cluster beam 402 (as shown in FIG. 4) to form a cluster beam 404, or irradiating the neutral cluster beam with a source of photons to photo-ionize a portion of the clusters.

In the case of the perpendicular electron beam, the ionization efficiency is relatively low because the ionizing region is generally small (though this is a function of the size and shape of the electron beam) and the electrons in the beam only make a single pass through the beam of neutral clusters and then are lost.

In straightforward photo-ionization techniques a diffuse or collimated beam of photons is directed at the neutral cluster beam, usually only making a single pass through the beam. For the same reasons, the ionization efficiency is likely to be low.

The ring-filament geometry shown in FIG. 3 appears in more detail in FIG. 5, where possible electron trajectories are shown. FIGS. 5A and 5B are functional block diagrams of a ring filament 500 and beam 502 arrangement viewed along the beam axis and perpendicular to the beam axis, respectively. Here it is assumed that the current in the electrically heated filament is low so as not to influence the electron trajectories. $V_f$ is the filament heating power supply and $V_a$ is the anode power supply used to bias the grid electrode used to accelerate the electrons. The filament voltage, $V_f$ is chosen to provide sufficient current flow in the filament so that the required number of thermal electrons can be thermally emitted.

A threshold for ionization occurs at the first ionization potential of the species to be ionized. For Ar atoms, the first ionization potential is approximately 15.7 volts. Thus, for ionization to occur $V_a$ must be greater than 15.7 volts (for Ar atoms). In the case of clusters rather than atoms, one can expect that the ionization potential is somewhat different from that for atoms. Highest ionization efficiency for many gases occurs when the impact ionizing electron has 2 to 3 times first ionization potential of the species to be ionized.

The quantities of electrons that can be produced in a space charge limited emission increase with increasing $V_a$. Thus, a rule of thumb that has been historically applied is that $V_a$ should be on the order of 3 or more times the expected first ionization potential for the species to be ionized. This means for most gases, that $V_a$ should be on the order of at least a few tens of volts. Typically, $V_f$ is a few volts and $V_a$ is a few tens of volts to a few hundred volts. The strong electric field between the thermionic filament and the anode grid assures that electrons, initially emitted from the thermionic filament with a small thermal energy, enters the cylindrical region within the anode grid traveling in a radial direction, and thus directed at the beam axis at the axis of the cylinder.

The cylindrical electric field in the region between the anode grid and the outer shield forms a cylindrical reflector for electrons which redirects electrons repeatedly toward the beam provided they make no collisions or do not escape the ends of the cylinder. A closed conductive container shields its interior from external electrical fields, so except for internal space charge, which is small in typical ionizers (and assuming the region to be free of magnetic fields), the interior of the anode cylinder is a field free region and the electron travels in a nearly straight line through the beam and back out of the grid, where the strong external fields reflect it back to the interior of the cylinder, again in a radial direction. It is seen that a single electron may orbit, making multiple passes through the beam axis with a resulting increased likelihood of ionizing a cluster.

Several mechanisms act to remove electrons. The higher electron density near the center (in the axial direction) of the cylinder (because the thermionic filament encircles this region) results in a central space charge that repels electrons toward both ends of the cylinder. Also, the existence of a positively charged beam in the downstream direction of the beam (because positive ions are created in the beam by electron impact ionization) tends to attract electrons towards the beam at the downstream end of the ionizer, where the electrons may escape the ionizer.

Electrons are also removed from the ionizer by collision. In order to make multiple passes through the ionizer, the residual gas pressure must be low enough so that the mean-free-path, $L_e$, of the electrons is at least several times larger than the diameter of the cylinder. Typical ionizers have diameters on the order of a few centimeters. At 300 Kelvins, in an Argon atmosphere, as might be the case when Ar gas clusters are being ionized, $L_e$, can be calculated to be approximately 3 cm at $10^{-2}$ Torr, approximately 30 cm at $10^{-3}$ Torr, and approximately 300 cm at $10^{-4}$ Torr. Hence, it is desirable that inside the ionizer, outside of the beam, the pressure be $10^{-3}$ Torr or less. Of course, inside the beam a higher collision cross section, therefore a shorter $L_e$ is desirable. It is desirable that the transparency of the anode grid to electrons be high (preferably 80% or more transparent) so that few electrons strike the anode.

However, a more important consideration for loss of electrons is that in the case of practical thermionic filaments, it is normal that the filament wire has a sufficiently large diameter to assure long filament life. In such case, a large electrical current flowing in the filament ($I_f$) is required to heat the thermionic filament to a temperature high enough that an adequate quantity of thermions is emitted. For practical reasons, such currents are usually DC. They produce a static magnetic flux (B) that surrounds the filament and said field influences the trajectories of electrons in the ionizer.

FIGS. 6A and 6B are schematic diagrams of a ring filament, a beam, and a magnetic field caused by the ring filament, viewed along the beam axis and perpendicular to the beam axis, respectively. As shown in FIGS. 6A and 6B, the interaction between a ring filament 600 and beam 602 produces a solenoidal magnetic field 604.

Figure 7:
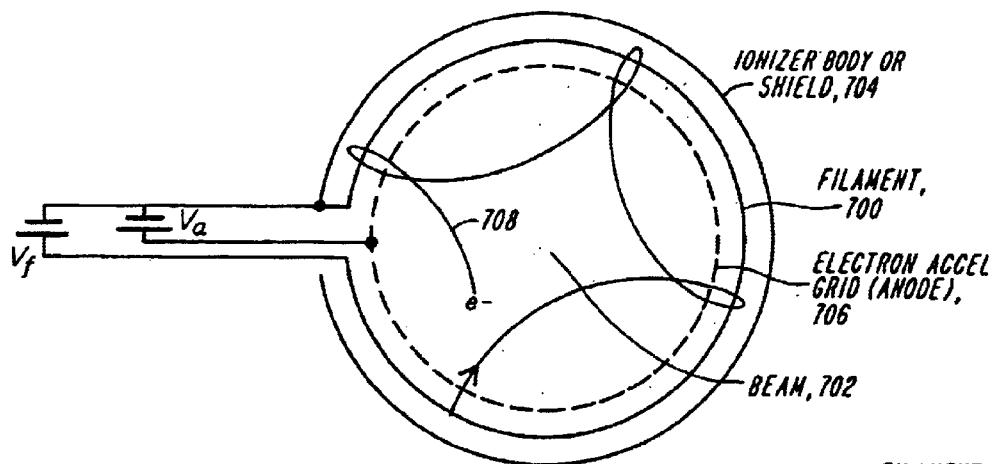
FIG. 7 is a schematic diagram of an arrangement of a ring filament, a beam, an ionizer body or shield, and an electron acceleration grid.

In the plane of the filament ring, the strength of the field is somewhat uniform (being a little stronger near the filament). The approximate effect of this field on the electron trajectories shown in FIG. 5 is to cause them to orbit around the magnetic flux lines. An example of a possible trajectory 708 for an electron in a solenoidal magnetic field is shown in FIG. 7. FIG. 7 is a schematic diagram of an arrangement of a ring filament 700, a beam 702, an ionizer body or shield 704, and an electron acceleration grid 706.

The radius of curvature of the electron orbit due to the magnetic field is smaller for increasing magnetic field. Hence, the exact shape of the trajectory 708 depends on the magnitude of the filament current, $I_f$, and the uniformity of the field. The important point is that because the initial trajectory is radial and because the orbit due to the magnetic field is (approximately) circular, the trajectories no longer pass through the beam and cylinder axis. The central region of the cylinder, where it is desired that beam ionization takes place, is sparse in electrons. If the beam is sufficiently large and the magnetic field not too strong, a portion of the beam may be traversed by the electrons, but the ring-filament geometry is clearly unfavorable for efficient ionization in the case of the large filament currents which are desirable.

Figure 8A:
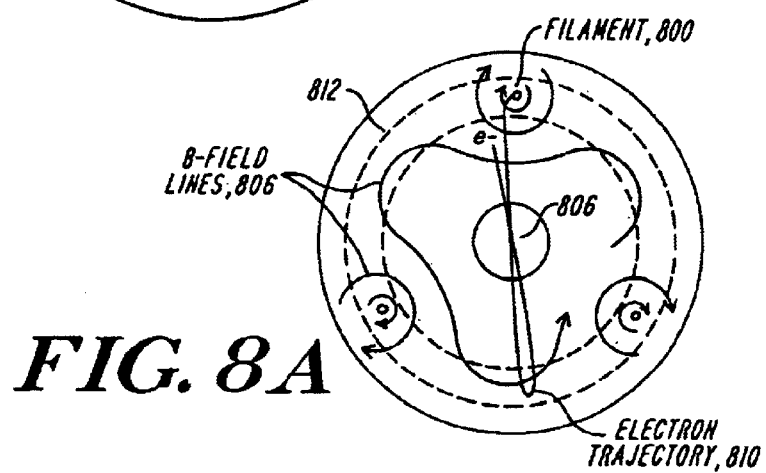
FIGS. 8A and 8B are functional block diagrams of a linear filament geometry ionizer configuration viewed along the beam axis and perpendicular to the beam axis, respectively.
Figure 8B:
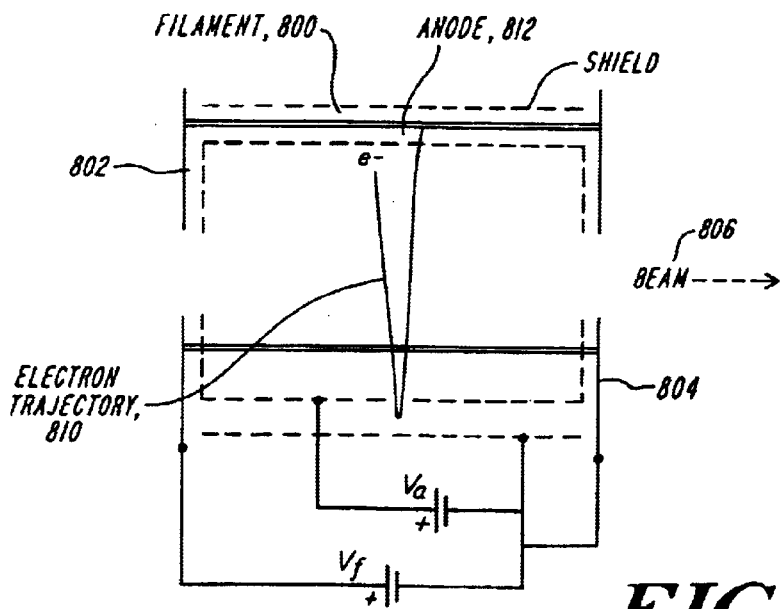

Another ionizer configuration is shown in FIGS. 8A and 8B. FIGS. 8A and 8B are functional block diagrams of a linear filament geometry ionizer configuration viewed along the beam axis and perpendicular to the beam axis, respectively. There are multiple (typically 3) parallel linear filaments 800 stretched between two endplates 802, 804 that serve as mechanical supports and electrical connections for the filaments. The filaments are parallel to the beam 806 and arrayed in a cylindrical pattern around the beam. Electrical current (dc) flows in the same direction in all the filaments, so they have a static magnetic field surrounding them with flux lines 808 (B).

In the typical case of three filaments, the magnetic field shape inside the cylinder is tricuspid, strongest nearest a filament and decreasing in intensity with increasing radial distance from the filament. The field influences the trajectories 810 of electrons inside the cylindrical anode screen. Neglecting space charge, the interior of a cylindrical anode screen is an electrical field free region so the magnetic field dominates the electron motion inside the anode cylinder. The electrons are deflected in the direction of the filament (conventional) current flow and drift toward one end of the ionizer.

If the conventional filament current flows in the direction the beam is traveling, the electron drift due to the resulting magnetic field will be opposite that direction. Along the beam axis, there will be no electrons at the exit of the ionizer and a concentration of electrons at the entrance, where they will recombine or escape the ionizer. The drift rate and hence the number of times the electrons cross the beam axis are dependent on the magnitudes of the filament currents and the resultant magnetic field strength. Higher filament currents will give a stronger gradient between entry and exit. The concentration at the entrance means that there is likely to be high recombination there and greater escape of electrons through the entrance aperture of the ionizer.

FIG. 9 is a schematic diagram illustrating the electron gradient and accumulation of electrons at one end for the case of uniform emission along the length of the filaments. There is an electron free zone 900, a zone 902 where electrons make only one pass through the beam, and an electron rich zone 904 where electrons make second and subsequent passes through the beam. Although this geometry is superior to the ring-filament geometry because it permits the electrons to cross the beam axis, sometimes more than once, it is not optimal because of the increasing axial electron gradient it produces with increasing filament current. The gradient results in increased electron loss at the high concentration end. This loss is enhanced if the electron concentration is at the cluster beam downstream end where positive beam space charge can help extract electrons from the electron rich zone. For this reason, it is best if the beam direction and the conventional current direction in the filaments are the same so that the magnetic field tends to cause the electrons to drift toward the entrance end of the ionizer.

To maximize the efficiency of the cylindrical ring-filament geometry, the central region of the ionizer should be as much as possible a field free region (to permit trajectories similar to those shown in FIG. 5), and the ends of the cylinder should be sealed as effectively as possible in order to reduce electron leakage at the ends. Replacing the ring filament with a non-inductively wound (or bifilar) filament can practically eliminate the magnetic field produced by the filament current. This improvement is shown in FIGS. 10A and 10B.

FIGS. 10A and 10B are functional block diagrams of a bifilar filament 1000 and beam 1002 arrangement viewed along the beam axis and perpendicular to the beam axis, respectively. If $V_a$ is much greater than the thermal energy of the electrons emitted by the filament, their motion at the anode screen will be generally radial in direction. With a single bifilar ring and no magnetic field, the electrons will tend to be concentrated in the plane of the filament with space charge causing them to drift away from that plane.

Figure 11:
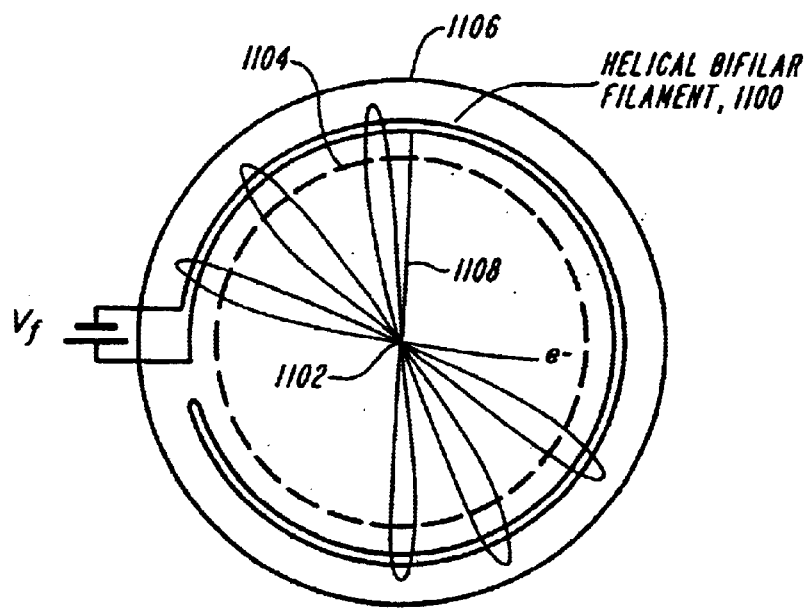
FIG. 11 is a schematic block diagram of the ionizer arrangement viewed along the beam axis.
Figure 12:
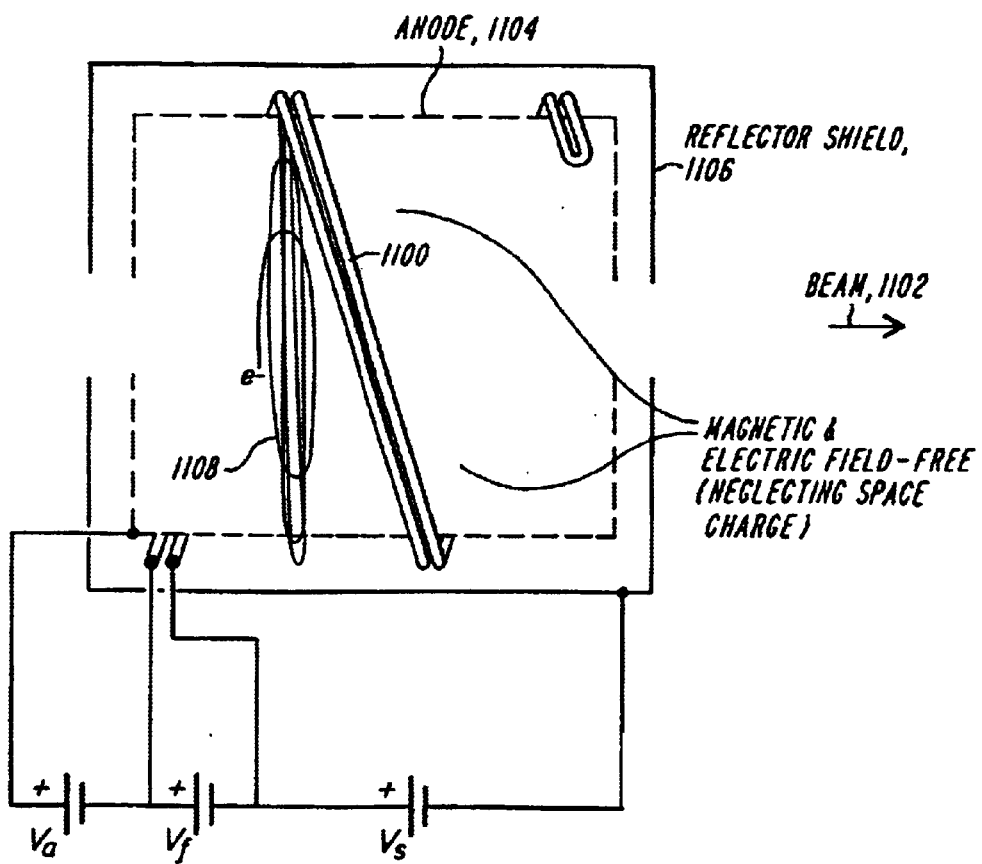
FIG. 12 is a schematic block diagram of the ionizer arrangement viewed perpendicular to the beam axis.

Making several bifilar filament loops or winding a helical (bifilar) filament 1100 around a cylindrical anode 1104 within a reflector shield 1106, has the advantage of distributing the electrons along the length of the cylinder and beam 1102 axis. FIGS. 11 and 12 are schematic block diagrams of the ionizer arrangement viewed along the beam axis and perpendicular to the beam axis, respectively, and is an example of such a configuration showing the orbital form 1108 for a single electron. Since the interior of the cylindrical anode screen is essentially field free, the electrons tend to orbit repeatedly through the beam without drift until they strike a gas cluster or some other object. By keeping the pressure low and using an anode screen transparent to electrons, the likelihood of collision with a cluster is increased.

Figure 13:
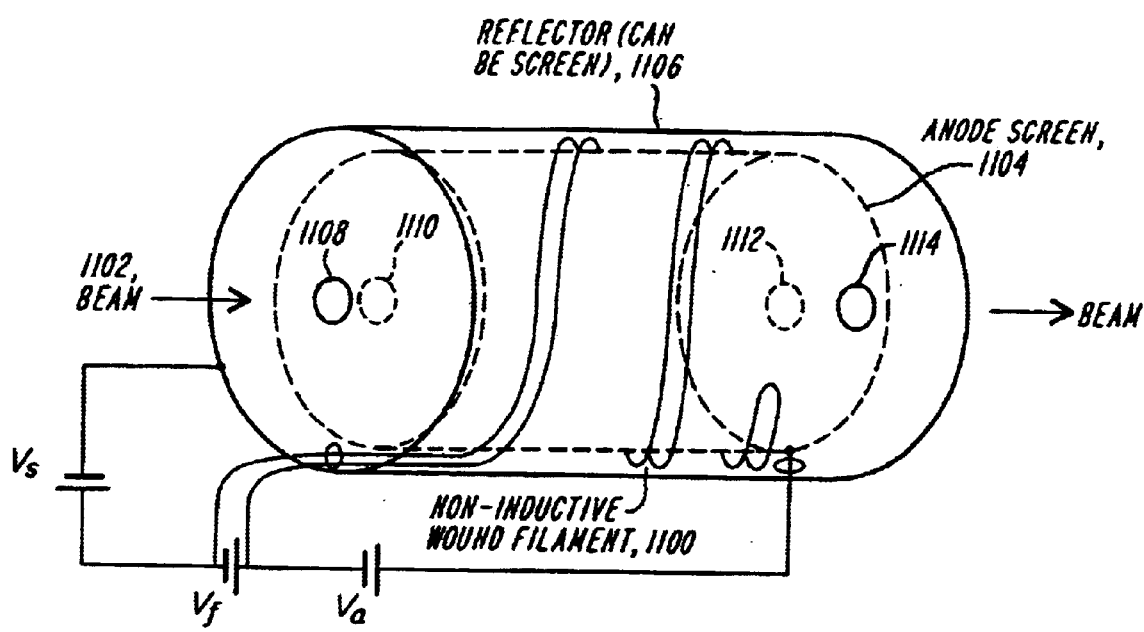
FIG. 13 is a perspective view of the ionizer arrangement of FIGS. 11 and 12 functional block diagrams of two alternative filament arrangements that provide for reversing direction of filament current frequent so as to provide self nullifying magnetic fields.

FIG. 13 is a perspective view of the ionizer arrangement of FIGS. 11 and 12. It will be appreciated that the anode screen and reflector (or shield, or enclosure) are both closed on the ends except for the beam aperture. Also, the reflector is biased ($V_S$) slightly (several volts) more negative than the most negative end of the filament to assure that no electron can strike the reflector and recombine. $V_S$ can be made zero with the result that only electrons emitted near the negative end of the filament can strike the shield, but setting $V_S$ to a few volts is better. Fewer electrons will recombine with the reflector, and the potential will help to prevent electrons from leaking out of the downstream end of the cylinder due to the beam's positive space charge near the downstream exit. The reflector can be a perforated enclosure or partially transparent screen to perm it effective vacuum pumping of the ionizer region so the electron mean-free-path, $L_e$ can be long.

Although the configurations of FIGS. 11 and 12 focus electron trajectories through the beam axis, by using an elliptical geometry a superior configuration can be achieved. The use of the optical properties of elliptical reflectors has been used to focus electrons.

Figure 14:
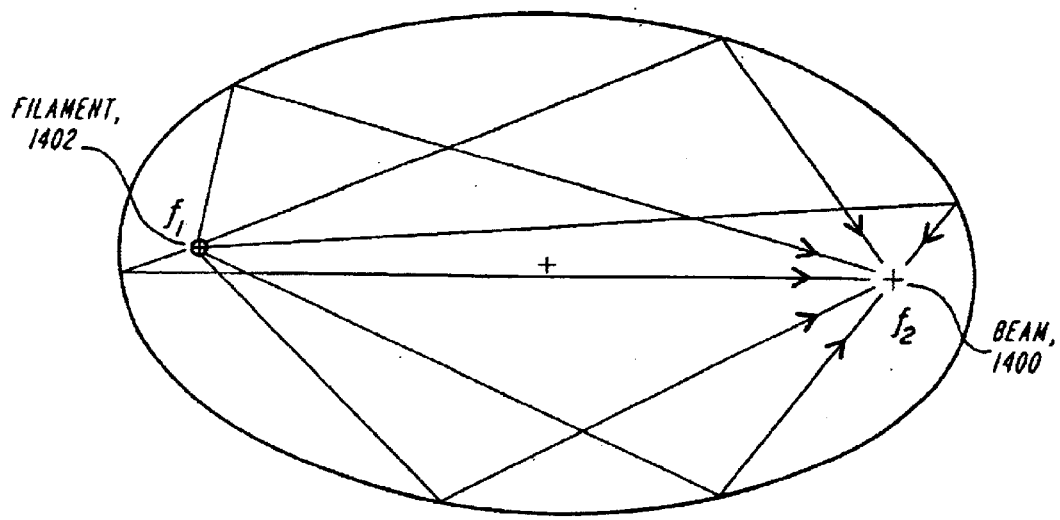
FIG. 14 is a schematic diagram of an arrangement in which a filament axis is at one focus of an elliptical cylinder and a beam axis is at the other focus, and the ellipse surface is constructed to be an electron reflector, so that all electrons from the filament must focus on the beam.

An ellipse has two foci. If the interior surface of an ellipse is a reflector, electrons emitted at one focus will be focused on the other focus. If a filament axis is at one focus of an elliptical cylinder and a beam axis is at the other focus and the ellipse surface is constructed to be an electron reflector, then all electrons from the filament must focus on the beam. This concept is illustrated in the diagram of FIG. 14. For an ellipse with its center (intersection of major and minor axes) at the origin, the equation of the ellipse is given by the equation:

$$(x^2/a^2)+(y^2/b^2)=1$$

where a is the length of the semi-major axis and b is the length of the semi-minor axis.

The foci are located on the major axis at a distances ±c from the center, where:

$$c^2=a^2-b^2$$

These two relationships permit locating the two foci of any ellipse if the lengths of the semi-axes are known or can be measured.

The ellipse in FIG. 14 has been drawn more eccentric than is necessary to achieve the usefulness of this concept in order to make the concept clear. In a practical situation, the two foci ($f_1$ and $f_2$) only need be separated by a large enough space to separate a beam 1400 and a filament 1402 and associated structures. The heated bare filament 1402 as shown FIG. 14 only emits low energy thermal electrons, and the quantity of such electrons is limited by space charge effects. It is desirable to provide an acceleration grid structure to increase the energy of the electrons and to extract larger electron currents.

Figure 15:
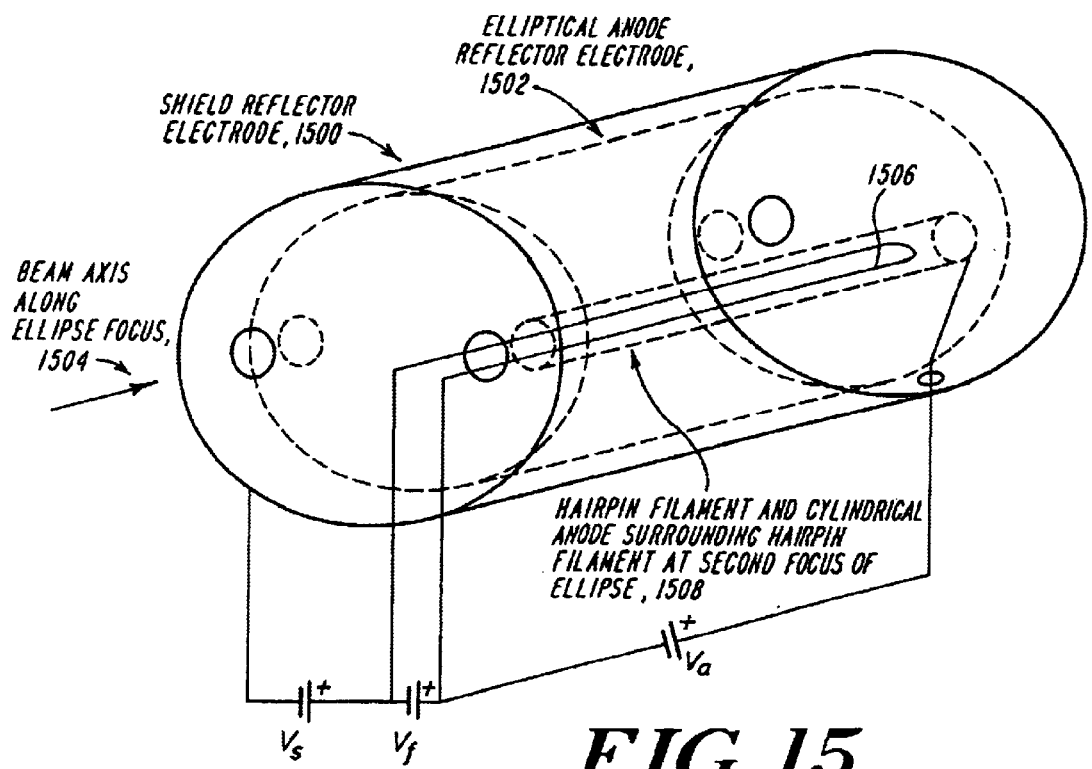
FIG. 15 is a perspective view of a functional block diagram of an elliptical filament and beam arrangement.
Figure 16A:
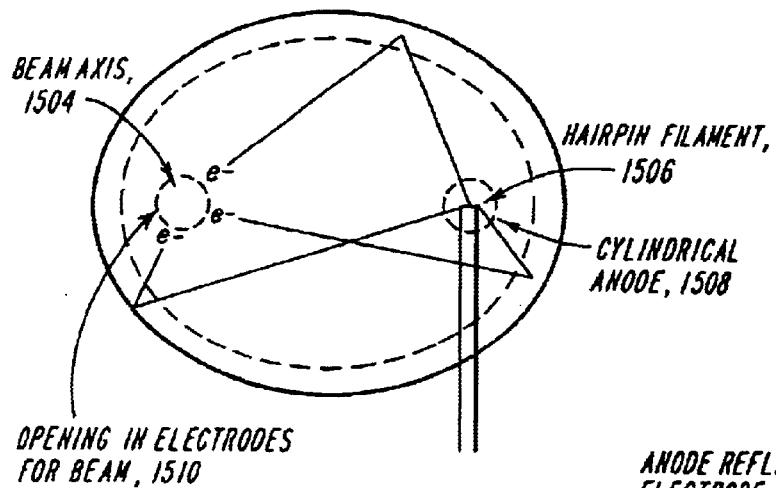
FIGS. 16A and 16B are functional block diagrams of the elliptical filament and beam arrangement of FIG. 15 viewed along the beam axis and orthogonal to the beam axis, respectively.
Figure 16B:
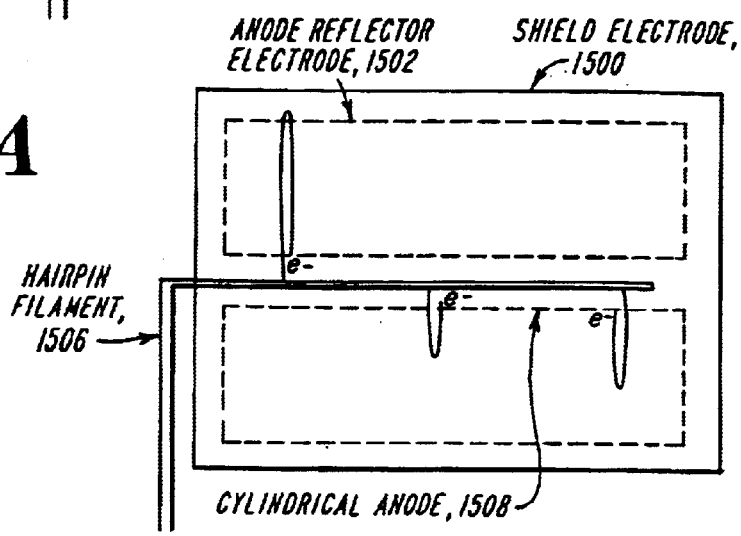

A functional block diagram of an elliptical filament and beam arrangement is shown in perspective in FIG. 15, and in two orthogonal views (along the beam axis and orthogonal to the beam axis, respectively) in FIGS. 16A and 16B. It will be appreciated that a reflector is defined by two electrodes, an outer electrode or shield 1500, which may be solid or a perforated surface or screen, and an inner electrode 1502, which is a high transparency (having electron transparency of 80% or greater) wire screen or similarly transparent electrode. The two reflector electrodes are both elliptical in section, having their foci at the same two locations (co-focal ellipses, specifically: $a_1^2 - b_1^2 = a_2^2 - b_2^2$, where $a_1$ and $b_1$ are semi-major and semi-minor axes respectively of the first ellipse and where $a_2$ and $b_2$ are semi-major and semi-minor axes for the second ellipse). The focal locations are arranged to coincide with the nominal centerlines of a beam path 1504 and a hairpin filament 1506. A cylindrical anode 1508 surrounding the hairpin filament is also high transparency screen and is connected to, or otherwise biased similarly to, the elliptical anode reflector element 1502.

$V_f$ is the filament heating power supply and $V_a$ is the anode power supply used to bias the circular cylindrical anode 1508 surrounding the hairpin filament 1506 to extract and accelerate the electrons from the electron cloud near the filament. The bifilar hairpin filament provides thermal electrons without providing a magnetic field strong enough to influence the electron trajectories within the ionizer appreciably. Typically $V_f$ is a few volts and $V_a$ is a few hundred volts.

The elliptical anode reflector screen electrode and the shield reflector electrode are both closed on the ends except for a beam aperture 1510 and filament opening. Also, the reflector is biased ($V_s$) slightly (a few volts) more negative than the most negative end of the filament to assure that no electron can strike the reflector and recombine. $V_s$ can be made zero with the result that only electrons emitted near the negative end of the filament can strike the shield, but setting $V_s$ to a few volts is better. Fewer electrons will recombine with the reflector, and the electrical potential will help to prevent electrons from leaking out of the downstream end of the cylinder near the beam aperture due to the beam's positive space charge near the downstream exit. It is acceptable that the shield reflector be a perforated enclosure or partially transparent screen to permit effective vacuum pumping of the ionizer region so the electron mean-free-path, $L_e$, can be long. If the shield reflector is a screen, then it is desirable to increase the magnitude of $V_s$ sufficiently that the reflection point occurs sufficiently distant from the shield reflector so that the reflecting equipotential surface (V≈filament potential) is smooth enough to be an accurate elliptical reflector (not influenced by the size of the screen mesh).

The strong electric field between the filament and the anode screen assures that electrons, initially emitted from the filament with a small thermal energy, exit the cylindrical anode screen and enter the elliptically cylindrical region within the anode grid traveling in a direction straight away from the focus of the ellipse, and thus appearing to have originated at the focus (having a virtual origin at the focus). This condition is accomplished when $V_a$ is large compared to the energy of thermions which assures that any non-radial component of velocity of the electrons when they exit the cylindrical anode screen is negligible compared to their radial velocity.

Figure 17:
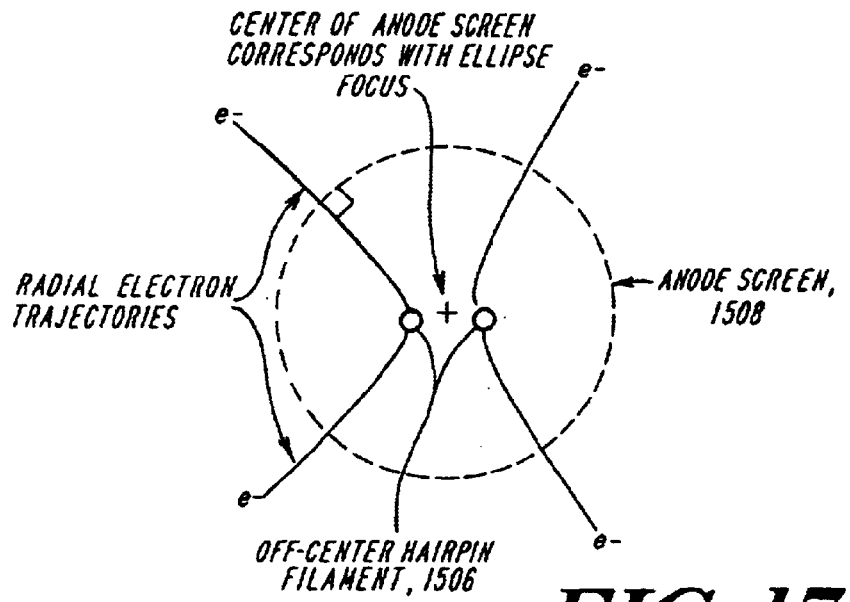
FIG. 17 is an enlargement of the filament and cylindrical anode screen portion of FIG. 16A.

FIG. 17 is an enlargement of the filament and cylindrical anode screen portion of FIG. 16A. FIG. 17 illustrates that the electrons appear to have originated at the focus of the ellipse. Since the majority of thermal electrons emitted by a filament of less than 3000 K have an energy of less than 0.5 eV, an anode voltage, $V_a$, of several tens of volts will suffice to establish the virtual source condition.

Inside the electric field free region (neglecting space charge) between the cylindrical anode screen and the elliptically cylindrical anode reflector electrode, the electrons travel in a straight line (as seen in FIG. 16). However, the strong electric field in the region between the elliptical anode grid and the elliptical outer shield forms an elliptical reflector for electrons which redirects electrons repeatedly toward two foci of the ellipse provided they make no collisions or do not escape the ends of the elliptical cylinder. A closed conductive container shields its interior from external electrical fields, so except for internal space charge, which is small in typical ionizers (and assuming the region to be free of magnetic fields), the interior of the elliptical anode cylinder is a field free region and the electron travels in a nearly straight line inside of the elliptical cylinder.

A single electron may orbit, making multiple passes through the beam axis with a resulting increased likelihood of ionizing a cluster. An electron that passes through the beam without collision may be reflected back through the circular cylinder anode grid toward the filament. There, it may be either reflected back, pass through the anode cylinder making another pass through the ionizer, or strike the filament. If it strikes the filament, it may stimulate the secondary emission of one or more additional electrons, perpetuating the process.

Figure 18:
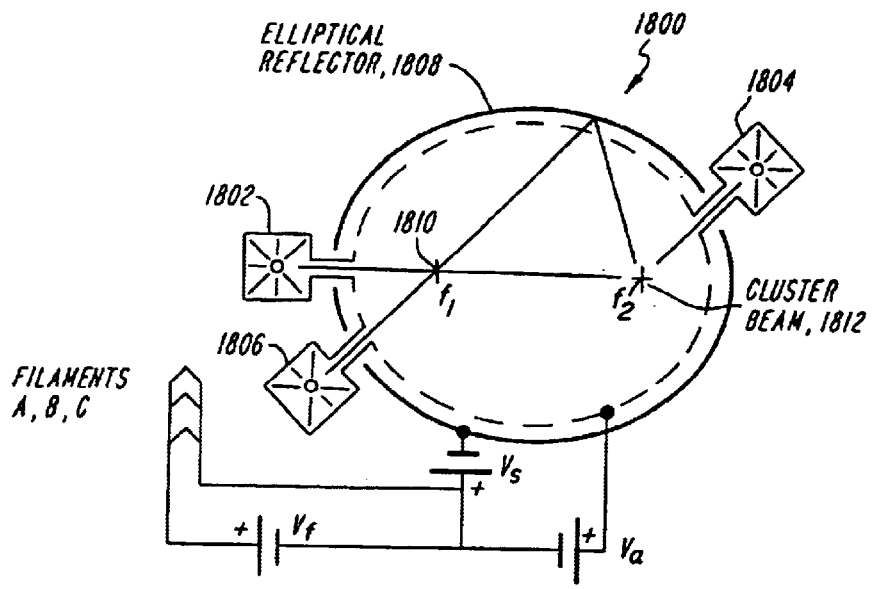
FIG. 18 is a functional block diagram of an alternative embodiment of an elliptical geometry ionizer in which one or more electron guns are utilized.

FIG. 18 is a functional block diagram of an alternative embodiment of an elliptical geometry ionizer 1800 in which a hairpin filament and circularly cylindrical anode screen are replaced with one or more electron guns 1802, 1804, 1806. The ionizer 1800 includes an elliptical reflector 1808 having a filament 1810 and a cluster beam path 1812 arranged at its foci. To be effective, electron guns should direct the electron beams through a focus of the ellipse and perpendicular to the cluster beam path. There can be multiple electron guns, but each should be pointed to direct the electrons through a focus of the ellipse.

The use of such electron guns can avoid the difficulty of obscuring part of the interior of the elliptically cylindrical ionizer by having a filament and anode cylinder there. As a result of the reduced likelihood of collision, the electron path length within the ionizer can be longer with corresponding increased ionization efficiency (greater probability that a single electron will ionize a cluster).

The electron beams must be disposed so as to pass first through one of the two foci of the ellipse. Thus, the electron beams will have a virtual origin at the focus. There are only two locations on the ellipse where the entering electron beam can be perpendicular to the tangent to the ellipse, namely, at the two ends of the major diameter of the ellipse. For simple mechanical construction, it may be convenient to locate a gun or guns at either end of a major diameter (as shown in FIG. 18, gun 1802). A linear array of guns can be placed along the line that corresponds to the locus of the ends of all major diameters of the ellipse. An alternative is to use a linear electron gun running along the outside length of the elliptical cylinder. Such an arrangement is shown in FIGS. 19A and 19B.

Figure 19A:
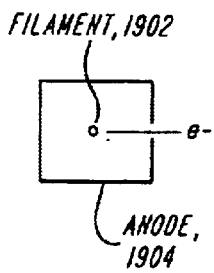
FIGS. 19A and 19B are functional block diagrams of an exemplary embodiment of a linear electron gun arrangement 1900 viewed along the filament axis and perpendicular to the filament axis, respectively.
Figure 19B:
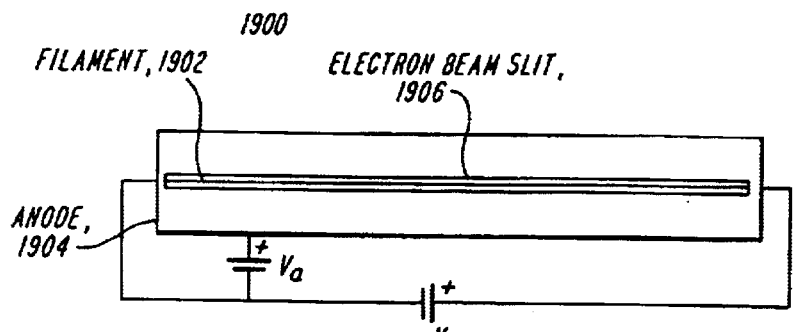

FIGS. 19A and 19B is a functional block diagram of an exemplary embodiment of a linear electron gun arrangement 1900 viewed along the filament axis and perpendicular to the filament axis, respectively. The gun includes a filament 1902, a surrounding anode 1904 and an electron beam slit along the length of the anode.

Figure 20:
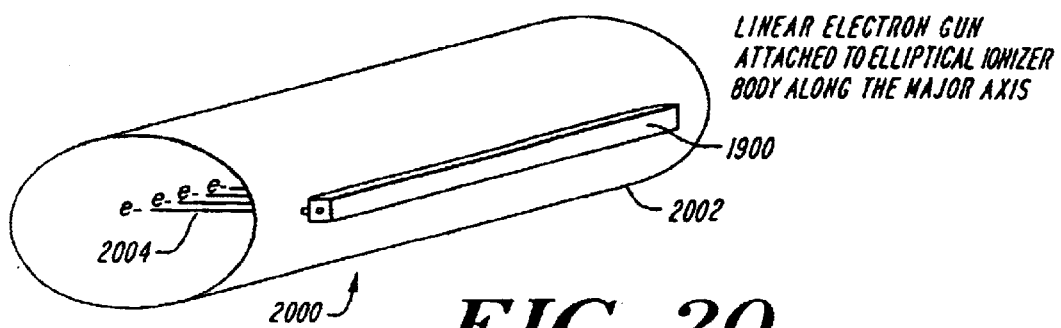
FIG. 20 is a perspective view of an exemplary embodiment of an ionizer arrangement.

FIG. 20 is a perspective view of an exemplary embodiment of an ionizer arrangement 2000. The ionizer includes an elliptical body 2002 with the gun arrangement 1900 attached along the major axis. The gun injects a sheet beam 2004 of electrons along the length of the ionizer.

An electron gun need not necessarily be located on a major diameter to be effective if it is directed so that its beam passes through a focus of the ellipse. Guns 1804 and 1806 of FIG. 18 are examples of an alternative arrangement.

In many GICB processing applications, it is desirable to avoid contamination of the work-piece with undesired atomic species during processing. Heated filaments such as the hairpin filament 1506 used in the elliptical geometry ionizer of FIGS. 15 and 16A–16B are generally of a metal such as tungsten, tantalum, or the like, and may evolve atoms or ions of the metal by evaporation when heated or by sputtering. An electron gun often includes a hot filament or entails a process that causes sputtering within the gun. Thus, an electron gun may also produce a beam of undesired contaminants, metal or otherwise.

Such contaminant atoms or ions may interact with the cluster beam so as to become entrained in or combined with the beam, contaminating it with the metal or other contaminant. A contaminated cluster beam may produce undesirable results at the work-piece. Hence, direct exposure of a beam to a filament or the output of an electron gun may not be desirable in some applications of GCIB. In FIG. 18, it can be seen that electron guns located at positions such as with guns 1802 (major diameter) and 1804 both are arranged so that the cluster beam is exposed to the direct output of the electron gun, including any contaminants it may be ejecting. However, electron gun 1806, by virtue of the reflecting property of the ionizer transmits electrons to the beam, but does not transmit any neutral or positively charged contaminants to the beam. The contaminants will be deposited on the elliptical reflector, or if the reflector is a screen, may pass through and subsequently be removed by the vacuum system. Thus, an ionizer having elliptical geometry and using an electron gun or guns not directed at the beam except through reflection and produce a lower level of GCIB contamination and improved processing results for contamination sensitive applications.

Although the present invention has been shown and described with respect to several preferred embodiments thereof, various changes, omissions and additions to the form and detail thereof, may be made therein, without departing from the spirit and scope of the invention.

What is claimed is:

1. A neutral beam ionizing apparatus for electron impact ionization of a substantially cylindrical neutral beam, said apparatus comprising:

a circularly cylindrical ionizing region, which is substantially free of magnetic fields; and an electron source comprising a filament capable of being heated for emitting electrons wherein the filament is shaped to provide for direction reversals of the filament current and the production of self-nulling magnetic fields so as to minimize the magnetic field in the ionizing region due to filament heating current.

2. The ionizing apparatus of claim 1, wherein said beam comprises a cluster beam.

3. The ionizing apparatus of claim 2, wherein said cluster beam comprises a gas cluster beam.

4. The ionizing apparatus of claim 1, wherein said electron source further comprises a circularly cylindrical anode screen electrode, disposed so as to be substanitally co-axial with the beam axis.

5. The ionizing apparatus of claim 4, wherein the filament is bifilarly or non-inductively wound around the circularly cylindrical anode screen electrode.

6. The ionizing apparatus of claim 4, wherein said electron source further comprises a circularly cylindrical reflector electrode, concentric with the circularly cylindrical anode screen electrode and biased so as to cause electrons emitted from said electron source to orbit repeatedly through the axis of the substantially cylndrical neutral beam.

7. A neutral beam ionizing apparatus for electron impact ionization of a substantially cylindrical neutral beam, having a beam axis, said ionizing apparatus comprising:

an elliptically cylindrical ionizing region; and at least one electron source comprising a filament capable of being heated for emitting electrons wherein the filament is shaped to provide for direction reversals of the filament current and the production of self-nulling magnetic fields so as to minimize the magnetic field in the ionizing region due to filament heating current.

8. The ionizing apparatus of claim 7, wherein the at least one electron source comprises a pair of co-focal elliptically cylindrical electrodes biased so as to cause electrons emitted from said at least one electron source to orbit repeatedly through the beam axis of the substantially cylindrical neutral beam.

9. The ionizing apparatus of claim 7, wherein the beam to be ionized comprises a cluster beam.

10. The ionizing apparatus of claim 9, wherein the beam to be ionized comprises a gas cluster beam.

11. A neutral beam ionizing apparatus for electron impact ionization of a substantially cylindrical neutral beam, having a beam axis, said ionizing apparatus comprising:

at least one electron source comprising a pair of co-focal elliptically cylindrical electrodes biased so as to cause electrons emitted from said at least one electron source to orbit repeatedly through the beam axis of the substantially cylindrical neutral beam; and an elliptically cylindrical ionizing region, wherein the beam axis lies substantially along a first focus of the elliptical cylinder and the electron source lies along a second focus of the co-focal elliptically cylindrical electrodes.

12. The ionizing apparatus of claim 11, wherein said at least one electron source comprises a non-inductively formed filament surrounded by a circularly cylindrical anode concentric with the second focus of the pair of co-focal elliptically cylindrical electrodes.

13. The ionizing apparatus of claim 11, wherein said at least one electron source comprises a virtual source such that said electrons travel in orbits appearing to originate at said second focus.

14. A neutral beam ionizing apparatus for electron impact ionization of a substantially cylindrical neutral beam, having a beam axis, said ionizing apparatus comprising:

at least one electron source comprising a pair of co-focal elliptically cylindrical electrodes biased so as to cause electrons emitted from said at least one electron source to orbit repeatedly through the beam axis of the substantially cylindrical neutral beam; and an elliptically cylindrical ionizing region, wherein the neutral beam axis lies substantially along the first focus of said co-focal elliptically cylindrical electrodes, and wherein the at least one electron source is disposed to lie outside of the elliptical cylinder and to direct at least one beam of electrons through a focus of said co-focal elliptically cylindrical electrodes.

15. The ionizing apparatus of claim 14, wherein said at least one electron source comprises at least one electron gun.

16. The ionizing apparatus of claim 14, wherein said at least one electron source comprises at least one linear electron gun.

17. The ionizing apparatus of claim 14, wherein said at least one electron source comprises at least one electron gun disposed to direct at least one beam of electrons through the second focus of said pair of co-focal elliptically cylindrical electrodes.

* * * * *